(12) United States Patent
Feeney

(10) Patent No.: US 6,564,571 B2
(45) Date of Patent: May 20, 2003

(54) HIGH AVAILABILITY ENERGY

(75) Inventor: Edward K. Feeney, New Albany, OH (US)

(73) Assignee: Liebert Corporation, Columbus, OH (US)

( * ) Notice: Subject to any disclaimer, the term of this patent is extended or adjusted under 35 U.S.C. 154(b) by 0 days.

(21) Appl. No.: 09/907,324

(22) Filed: Jul. 17, 2001

(65) Prior Publication Data

US 2002/0134098 A1 Sep. 26, 2002

Related U.S. Application Data

(60) Provisional application No. 60/218,752, filed on Jul. 17, 2000.

(51) Int. Cl.$^7$ .............................................. F25D 23/12
(52) U.S. Cl. ....................... 62/259.2; 165/80.2; 361/692
(58) Field of Search ............................... 62/259.2, 136, 62/236; 361/692, 687, 688; 165/80.2, 80.3, 86, 185

(56) References Cited

U.S. PATENT DOCUMENTS 5,860,291 A * 1/1999 Johnson et al. ............. 62/259.2
6,018,192 A * 1/2000 Root et al. .................. 257/714
6,141,214 A * 10/2000 Ahn ............................ 361/687

\* cited by examiner

*Primary Examiner*—Melvin Jones
(74) *Attorney, Agent, or Firm*—Howrey Simon Arnold & White LLP

(57) ABSTRACT

A rack system for mounting electronic devices such as computers or telecommunication devices is disclosed. The rack includes an integrated liquid heat exchange cooling system for dissipating the heat generated by the electronic devices. The rack also includes integrated alternating current and direct current power supplies for supplying power to the electronic devices. The entire system is of modular construction, providing both scalability and redundancy.

20 Claims, 5 Drawing Sheets

HIGH AVAILABILITY ENERGY

This application claims priority from provisional application No. 60/218,752, filed Jul. 17, 2000, having the same title and naming the same inventor as the present application.

BACKGROUND OF THE INVENTION

With the expansion of telecommunication and computer technology, increasing amounts of electronic equipment are required at various commercial and business facilities. To facilitate interconnection and access to such equipment, it is typically installed in a rack structure. The amounts of electronic equipment required in many commercial. installations may result in numerous rack structures being required to accommodate all of the required equipment. Furthermore, technological advancements permit more and more electronic equipment to fit into increasingly smaller spaces. These forces are combining to produce relatively dense electronic installations that require significant amounts of power and that generate increasing amounts of heat.

For such equipment to operate properly, and to maintain comfort for persons operating and working on such equipment, a relatively stable and comfortable temperature and humidity must be provided. This has typically been accomplished through the use of air-to-air cooling and conventional air conditioning. As the density of electronic equipment has increased, it has become increasingly difficult to remove the heat generated using the air-to-air cooling and conventional air conditioning alone. It has become necessary to install additional localized cooling for the rack structures and enclosures containing electronic equipment. To efficiently remove the heat generated by the electronic equipment this localized cooling is frequently liquid-based, for example using chilled water or glycol.

The power requirements of today's electronic equipment have also presented numerous challenges. For example, the devices required in a typical commercial installation may require either alternating current or direct current power in one or more of a number of standard voltages. Furthermore, many facilities are required to operate around-the-clock and thus require continuously available sources of power. In addition, sophisticated electronic systems require highly regulated and stable power sources, which minimize the risk of malfunction or damage to the sensitive electronic because of undesirable transient irregularities in the supplied power.

SUMMARY OF THE INVENTION

It is therefore an object of the present invention to provide a system for providing cooling and power for rack-mounted electronics. It is a further object of the present invention to provide cooling that is highly efficient by using a liquid-based cooling system. Still another object of the present invention is to provide a redundant cooling system in which failure of part of the cooling system does not prevent operation of the electronic equipment and in which the remaining operational portions of the cooling system have sufficient capacity to cool the entire electronic system.

Yet another object of the present invention is to provide an integrated system for supplying the power requirements of diverse electronic equipment. It is an object of the present invention to provide both alternating current and direct current power to the electronic equipment. A further object is to provide high quality power that is uninterruptible and redundant as well as modular and scalable.

DESCRIPTION OF ILLUSTRATIVE EMBODIMENTS

Figure 1:
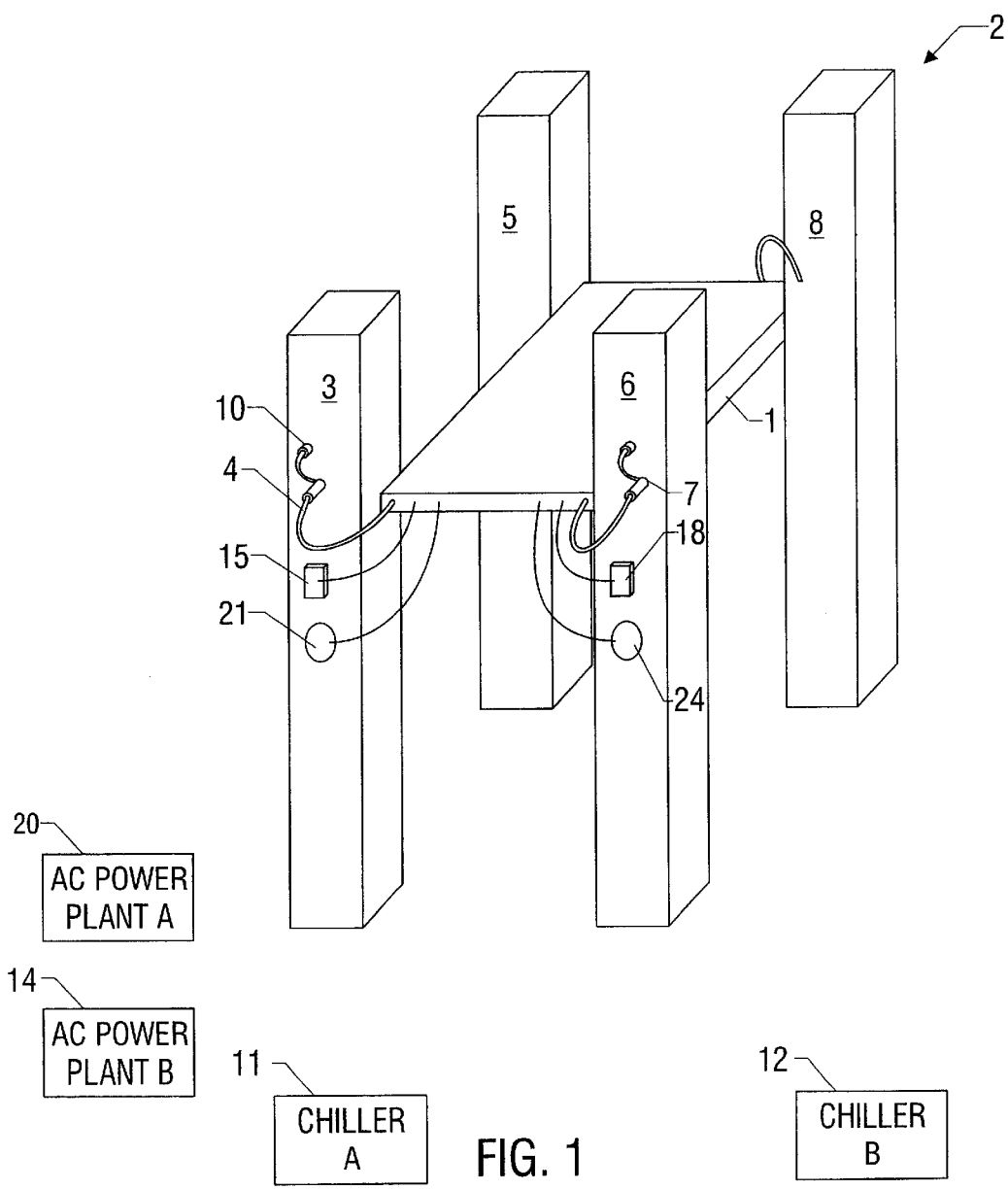
FIG. 1 is a schematic illustration of a rack with redundant cooling and power supplies in accordance with the present invention.

A rack for mounting electronic equipment and providing power and cooling in accordance with the present invention is illustrated in FIG. 1. An electronic device 1, such as a computer or telecommunications system component is horizontally mounted in the rack 2. The contemplated rack structure. is constructed in accordance with the industry standard EIA 310. The EIA standard requires a 19-inch width for the rack and a 1¾ standard mounting unit height, designated as 1 u. A 3½ inch unit would be designated as requiring 2 u of space.

Built into the rack structure is a first supply for chilled cooling fluid 3. The chilled cooling fluid is from an external source, and may be either water. glycol, a mixture of the two, or other cooling fluids known in the art. The first cooling fluid supply 3 is connected to electronic device 1 by cooling fluid connection valve 4. Electronic device 1 is constructed to include heat exchange cooling circuits within the device housing arranged to cool the electronic components. Cooling fluid connection valve 4 may be of any type adapted for repeated connection and disconnection. After cooling fluid passes through the heat exchange coils within electronic device 1, it enters into first cooling fluid return 5. Cooling fluid return 5 is also built into rack 2, and returns the now heated fluid to the external chiller.

A second supply of chilled cooling fluid 6 is also built into the rack structure 2. The second cooling fluid supply 6 is also connected to electronic device 1. Second cooling fluid supply 6 is coupled to electronic device 1 by cooling fluid connection valve 7. Cooling fluid supplies 3 and 6 are fully redundant, including separate feeders, not shown but discussed below. Electronic device 1 is constructed to include additional redundant heat exchange cooling circuits within the device housing arranged to cool the electronic components. Each heat exchange circuit of electronic device 1 is constructed so as to provide the full cooling capacity required by the electronic components, thereby providing complete redundancy; which allows for continued operation in the event that one of the cooling circuits experiences a failure. After cooling fluid from the second cooling circuit passes through the heat exchange coils within electronic device 1, it enters into second cooling fluid return 8. Cooling fluid return 8 is also built into rack 2, and returns the fluid to the external chiller.

The cooling fluid circuits constructed in rack 2 also include pneumatic blow-downs 9, which prevent the leakage of cooling fluid into rack 2 and onto electronic components contained within rack 2. The blow-downs 9 operate using compressed air, which is also produced from an external source and is available at air supply valve 10.

Figure 3:
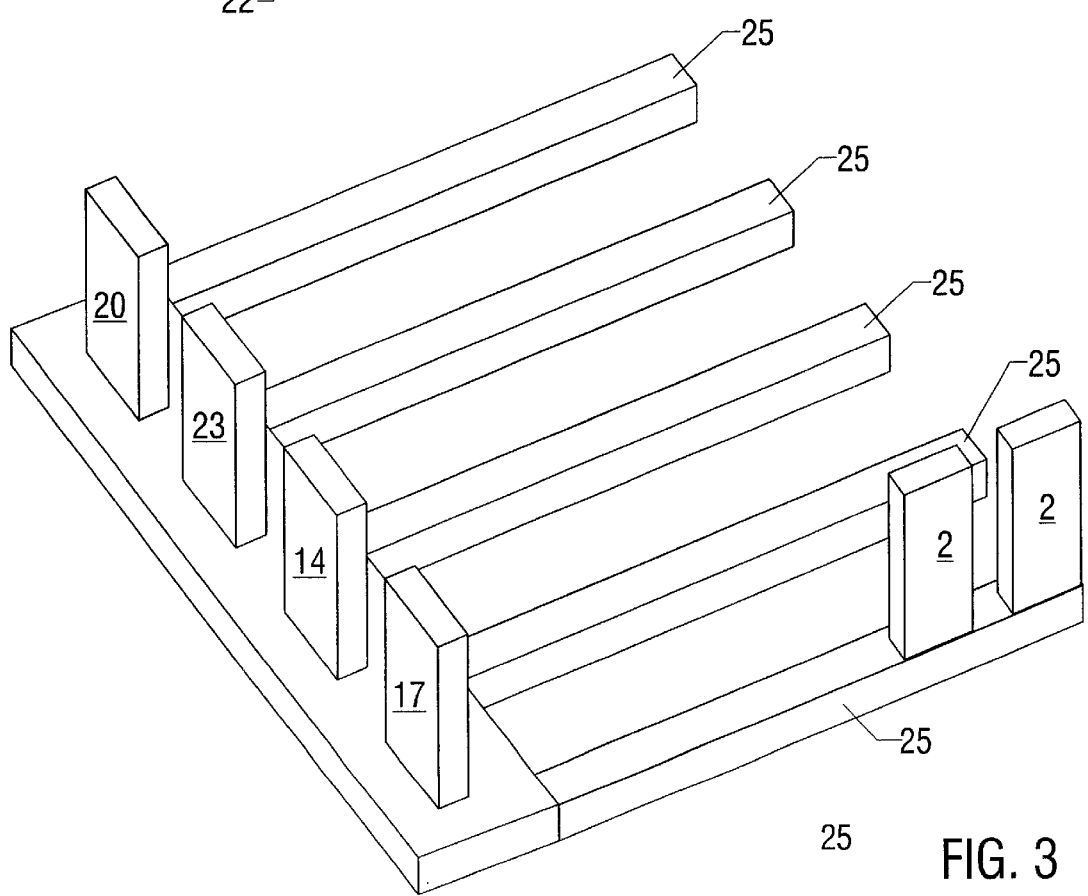
FIG. 3 is a schematic illustration of a number of energy platforms and racks with the required power supplies and cooling equipment.
Figure 4:
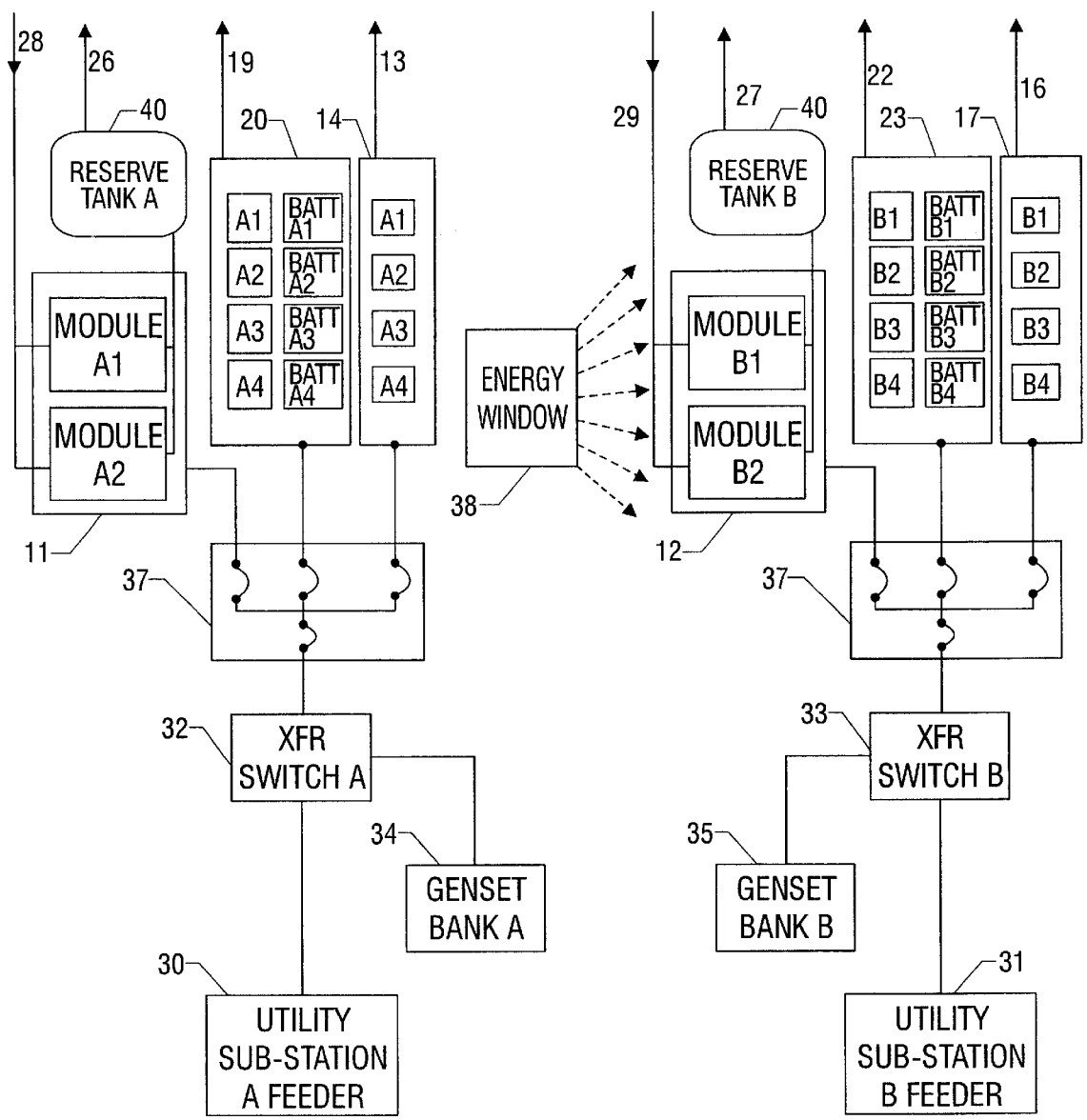
FIG. 4 is a one-line diagram of a scalable, redundant cooling and power system in accordance with the present invention.

Cooling fluid supplied to the first cooling circuit is supplied from a first chiller 11, not shown in FIG. 1, but illustrated schematically in FIGS. 3 and 4. Cooling fluid for the second cooling circuit is supplied from a second chiller 12, also illustrated schematically in FIGS. 3 and 4. To provide redundancy, scalability, and flexibility, chillers 11 and 12 may also be constructed as modular, redundant systems. For example, the chillers may include multiple pumps for circulating the cooling fluid. These multiple pumps provide additional capacity by operation in tandem and redundancy by having an extra pump available in the event of a pump failure. The chillers may also include multiple compressors, evaporators, and condensers for providing the cooling capacity required to chill the cooling fluid as well as providing for continued operation in the event of a failure. Chillers 11 and 12 are also supplied by redundant power supplies and are controlled and monitored by redundant control systems.

Rack system 2 also provides power to electronic device 1. Because many electronic devices require both alternating current (AC) and direct current (DC) power, rack system 2 is configured to supply both. A first DC power bus 13 (shown in FIG. 2) receives power from a first DC power supply 14 (shown in FIG. 3). DC power to the electronic device 1 is provided through DC circuit breaker 15. Numerous DC circuit breakers are provided for connecting DC power bus 13 to numerous electronic devices within the rack structure 2. DC power bus 13 is connected through DC circuit breaker 15 to electronic device 1 through any number of connector types that are known in the prior art.

A second DC power bus 16 (shown in FIG. 2) receives power from a second DC power supply 17 (shown in FIG. 3). Second DC bus 16 provides a redundant source of DC power for the electronic device 1. Second DC bus 16 provides power to electronic device 1 through DC circuit breaker 18. Numerous DC circuit breakers are also provided for connecting second DC power bus 16 to multiple electronic devices within the rack structure. Connection between second DC power bus 16 and electronic device 1 may be made with any of a number of connector types that are known in the art.

Rack system 2 also provides AC power to electronic device 1. A first AC power bus 19 (shown in FIG. 2) receives power from a first AC power supply 20 (shown in FIG. 3). AC power supply 20 is preferably an uninterruptible power supply (UPS). The UPS is preferably a modular, scalable, and redundant unit, such as the Nfinity™ UPS produced by Liebert Corporation, which is described in co-pending U.S. Provisional Patent Application No. 60/183,522, which is hereby incorporated by reference in its entirety. AC power to the electronic device 1 is provided through AC circuit breaker 21. Numerous AC circuit breakers are provided in the preferred embodiment for connecting AC power bus 19 to numerous electronic devices within the rack structure 2. AC power bus 19 is connected through AC circuit breaker 21 to electronic device 1 through any number of connector types that are known in the prior art.

A second AC power bus 22 (shown in FIG. 2) receives power from a second AC power supply 23 (shown in FIG. 3), which is also preferably a modular, scalable, redundant UPS. Second AC bus 22 provides a redundant source of AC power for the electronic device 1. Second AC bus 22 provides power to electronic device 1 through AC circuit breaker 24. Multiple AC circuit breakers are also provided for connecting second AC power bus 22 to multiple electronic devices within the rack structure. Connection between second DC power bus 16 and electronic device 1 may be made with any of a number of connector types that are known in the art.

Figure 2:
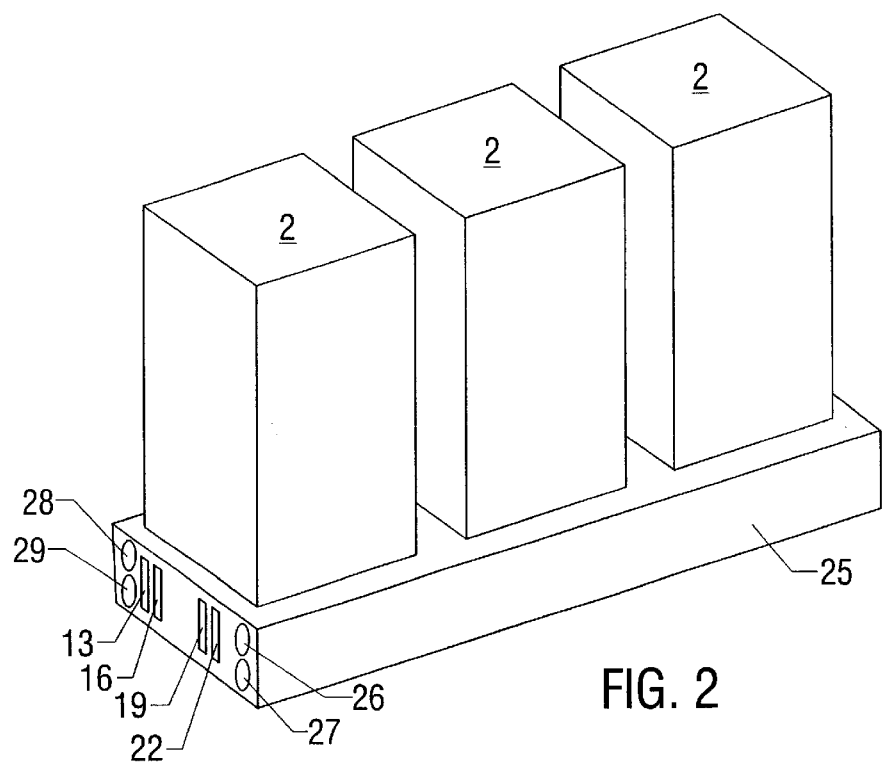
FIG. 2 is a schematic illustration of an energy platform for supplying cooling fluid, alternating current power, and direct current power to the rack of FIG. 1.

Turning now to FIG. 2, multiple rack structures 2, as described above, are mounted atop an energy platform 25. The frame structure of energy platform 25 is designed to support the weight of all of the rack structures together with the electronic equipment mounted therein. Energy platform 25 also provides connections for cooling water, DC power and AC power from their respective sources to the rack structures. Cooling fluid supply piping 26 for the first cooling circuit and cooling fluid supply piping 27 for the redundant second cooling circuit are included within energy platform 25. The cooling fluid supply piping 26 and 27 deliver chilled cooling fluid from the redundant chillers 11 and 12 respectively to the rack structures 2 mounted atop the energy platform 25. The return piping for the first cooling circuit 28 and the return piping for the second cooling circuit 29 are also included within energy platform 25. Return piping 28 and 29 return the heated cooling fluid to chillers 11 and 12 for cooling.

Energy platform 25 also includes the AC and DC power connections between the power supplies and the rack structures. Redundant DC busses 16 and 19 deliver DC power from DC power supplies 14 and 17 to rack structures 2 and the electronic equipment mounted therein. Redundant AC busses 19 and 22 deliver AC power from the redundant AC UPS 20 and 23.

Both the cooling water piping and the electrical bus structures are designed with an interconnectable modular design that allows a number of rack structures to be mounted atop the structure and easily connected to the cooling loops and power supplies. The energy platforms 25 are also interconnectable to provide power from, the power supplies and cooling fluid chillers as illustrated schematically in FIG. 3.

FIG. 4 illustrates a one-line diagram of a system implementing the present invention. The system has as a primary power source a pair of redundant utility substation feeders 30 and 31. Utility substation feeder delivers power to transfer switch 32, while utility substation feeder 31 delivers power to transfer switch 33. Transfer switches 32 and 33 have as alternate power sources engine generator sets 34 and 35. Generator sets 34 and 35 may each comprise a plurality of generator sets connected in parallel to provide modularity or redundancy. Transfer switches 32 and 33 deliver power to distribution panels 36 and 37. Distribution panels 36 and 37 include individual circuit breakers that feed chillers 11 and 12, AC UPSs 20 and 23, and DC power supplies 14 and 17, respectively.

As discussed above, chillers 11 and 12 may comprise multiple modular and redundant components to provide both scalable operation and reduced probability of failure. Chillers 11 and 12 also include reserve tanks 39 and 40 respectively to provide for storage of cooling fluid. Likewise both the DC power supplies 14 and 17 and the AC power supplies 20 and 23 may include numerous modular and redundant components.

Figure 5:
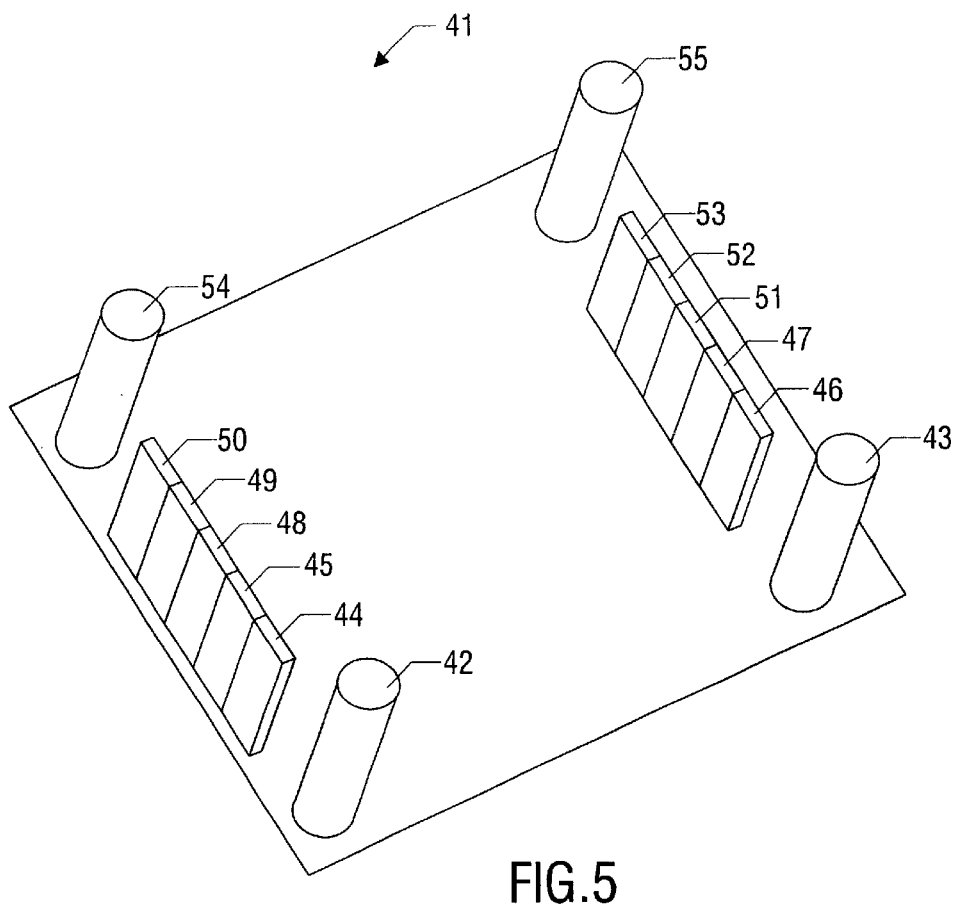
FIG. 5 illustrates a quick connect plug/socket arrangement for use with a system in accordance with the present invention.

FIG. 5 schematically indicates a quick connect plug-socket arrangement 41 for connecting the rack structures 2 to the energy platform 25. The plug-socket arrangement includes first cooling source connection 42 and second cooling source connection 43, which will connect each rack structure 2 to first cooling fluid source 26 and second cooling fluid source 27 respectively. Cooling fluid return connectors 54 and 55 return the cooling fluid to coolant return lines 28 and 29 after the cooling fluid has absorbed heat from the electronic device.

The plug-socket arrangement 41 also includes positive connector 44 and negative connector 45 for connection to first DC power bus 13. Positive connector 46 and negative connector 47 serve to connect rack structure 2 to second DC power bus 16. Plug-socket arrangement 41 also includes AC connectors 48, 49, and 50 for connecting the energized conductor, the neutral conductor, and the ground conductor of first AC power bus 19 to rack structure 2. AC connectors 51, 52, and 53 are also provided to connect AC power bus 22 to rack structure 2.

Figure 6:
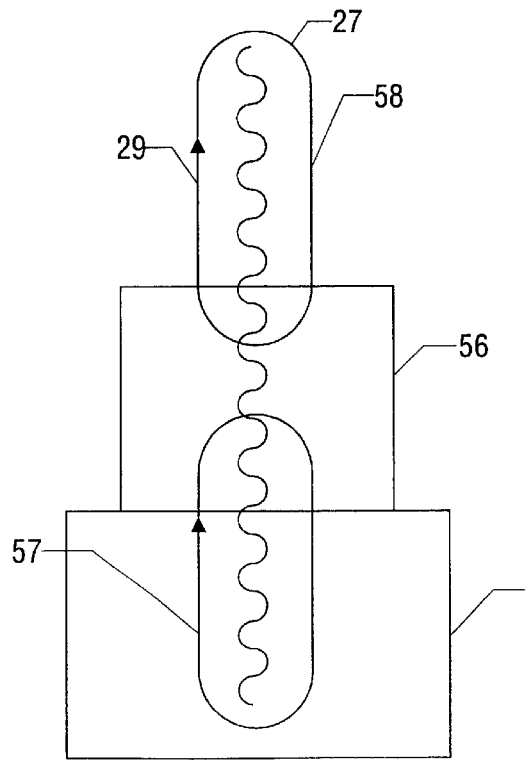
FIG. 6 is a schematic illustration of an device using an intermediate heat exchanger as part of the present invention.

FIG. 6 illustrates schematically illustrates a heat exchanger arrangement for use with the system of the present invention wherein there is an intermediate heat exchanger 56 between the cooling coils 57 contained within electronic device 1 and the coolant loop 58, which comprises coolant source 27 and coolant return 29. In one embodiment of the present invention, coolant entering the intermediate heat exchanger 56 from the chiller side is at a temperature of around 35 degrees Fahrenheit. The coolant is heated within intermediate heat exchanger 56 to a temperature of around 45 degrees Fahrenheit. This temperature rise results from exchange of heat between cooling loop 58 and cooling coils 57, located within electronic device 1. The cooling fluid within coils 57 enters the coils at a temperature of approximately 45 degrees Fahrenheit and exits coils 57 at a temperature of approximately 55 degrees Fahrenheit.

Figure 7:
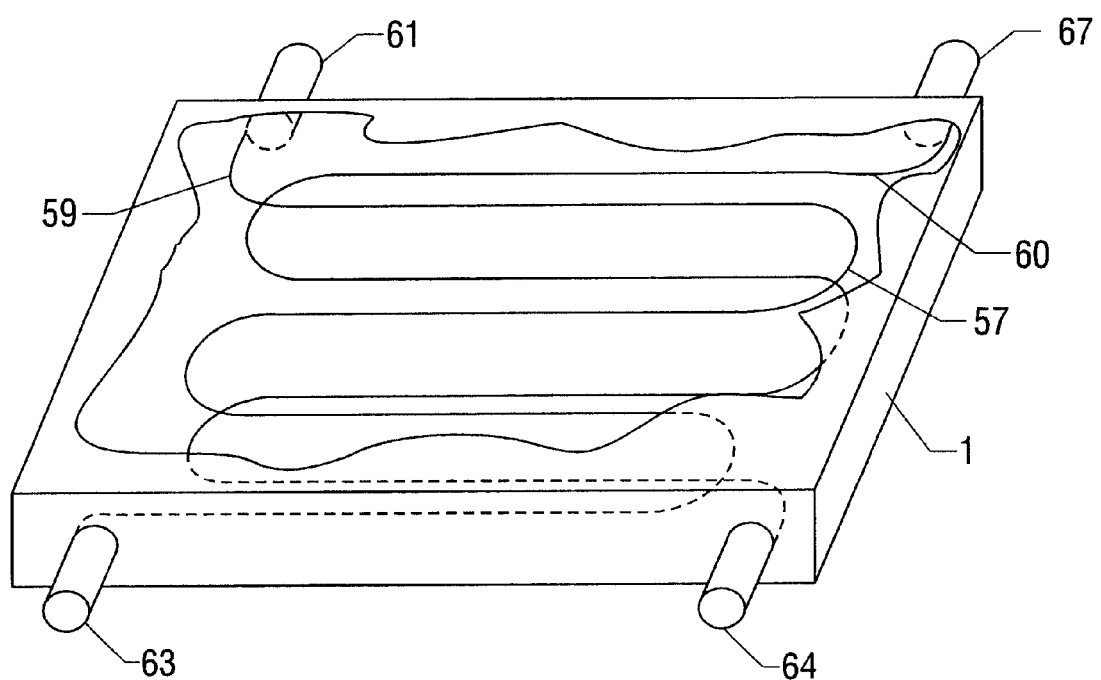
FIG. 7 is a diagram illustrating the interweaving cooling coils in the cooling device in accordance with the present invention.

FIG. 7 illustrates the circuiting of cooling coils 57 within electronic device 1. Cooling coils 57 actually comprise two individual isolated cooling coils 59 and 60. The cooling coils are disposed within the electronic device such that either coil alone is capable of providing the cooling capacity required by electronic device 1. Cooling coil 59 is a first cooling coil connected to cooling fluid source 3 at coolant valve 4 as described above by connector 61. The coolant passes through coil 59 and exits through connector 63 to coolant return 5. Similarly, cooling coil 60 is a second cooling coil connected to cooling fluid source 6 at coolant valve 7 as described above by connector 62. The coolant passes through coil 60 and exits through connector 64 to coolant return 8.

The disclosed modular cooling and power system may be produced in various sizes for installations requiring different capacities of cooling or electrical power. Exemplary capacities are illustrated in Table 1 below:

| System Size | No. of Racks | Cooling Cap. | AC Power Cap. | DC Power Cap. |
| --- | --- | --- | --- | --- |
| Small | 1 to 4 | 5 tons | 20 kW | 5 kW |
| Medium | 4 to 20 | 30 tons | 100 kW | 25 kW |
| Large | 20 to 50 | 75 tons | 250 kW | 75 kW |
| Data Center | 50 to 500 | 600 to 800 tons | 4 MW | 1 MW |

Additional modifications and adaptations of the present invention will be obvious to one of ordinary skill in the art, and it is understood that the invention is not to be limited to the particular illustrative embodiments set forth herein. It is intended that the invention embrace all such modified forms as come within the scope of the following claims.

REFERENCES

The following references, to the extent that they provide exemplary procedural or other details supplementary to those set forth herein, are specifically incorporated herein by reference.

Provisional application for U.S. Letters Patent Serial No. 60/183,522

What is claimed is:

1. An apparatus for providing support, cooling and power to electronic devices comprising:

a rack;

a fluid cooling system integral with said rack connected to an external cooling system and comprising fluid paths delivering cooling fluid to the electronic devices; and a power supply system integral with said rack, the power supply system connected to an external power supply and comprising electrical circuits delivering power to the electronic devices.

2. The apparatus of claim 1 wherein said fluid cooling system comprises a plurality of redundant fluid paths.

3. The apparatus of claim 1 wherein said power supply system comprises a plurality of redundant electrical circuits.

4. The apparatus of claim 2 wherein said power supply system comprises a plurality of redundant power supply circuits.

5. The apparatus of claim 3 wherein said power supply system comprises both AC and DC circuits.

6. The apparatus of claim 4 wherein said power supply system comprises both AC and DC circuits.

7. The apparatus of claim 1 wherein the external cooling system comprises a plurality of redundant chiller circuits.

8. The apparatus of claim 1 wherein the external power supply system comprises a plurality of redundant power supplies.

9. The apparatus of claim 8 wherein the plurality of redundant power supplies includes AC and DC power supplies.

10. The apparatus of claim 7 wherein the external power supply system comprises a plurality of redundant power supplies.

11. The apparatus of claim 10 wherein the plurality of redundant power supplies includes AC and DC power supplies.

12. The apparatus of claim 1 further comprising a quick connect mechanism for connecting the electronic device to the fluid cooling system and the power supply system, the quick connect device comprising first and second fluid source connectors, first and second fluid return connectors, first and second AC power connectors, and first and second DC power connectors.

13. An apparatus for providing power and cooling to electronic devices comprising:

means for mounting the electronic devices;

means for providing heat removal from the electronic devices integral with the means for mounting;

means for providing power to the electronic devices integral with the means for mounting.

14. The apparatus of claim 13 wherein the means for providing heat removal comprises a plurality of redundant heat removal means.

15. The apparatus of claim 13 wherein the means for providing power comprises a plurality of redundant power supply means.

16. A method of providing support, cooling and power to electronic devices comprising the steps of:

providing a support structure for the electronic devices;

delivering cooling fluid through a plurality of redundant cooling fluid paths integral with the support structure, the cooling fluid paths connecting the electronic devices to an external source of cooling fluid; and delivering power through a plurality of redundant power supply circuits integral with the support structure, the power supply circuits connecting the electronic devices to an external source of power.

17. An apparatus for providing support, cooling and power to electronic devices comprising:

an energy platform, the energy platform providing connection to redundant cooling and power sources and providing physical support for a plurality of rack structures;

a plurality of racks;

a fluid cooling system integral with each rack connected to an external cooling system and comprising fluid paths delivering cooling fluid to the electronic devices; and a power supply system integral with rack, the power supply system connected to an external power supply and comprising electrical circuits delivering power to the electronic devices.

18. The apparatus of claim 17 wherein the energy platform further comprises piping for a plurality of redundant cooling circuits.

19. The apparatus of claim 17 wherein the energy platform further comprises a plurality of busses for redundant AC and DC power sources.

20. The apparatus of claim 18 wherein the energy platform further comprises a plurality of bussses for redundant AC and DC power sources.

* * * * *